United States Patent
Niwa et al.

(10) Patent No.: US 11,770,094 B2
(45) Date of Patent: Sep. 26, 2023

(54) MOTOR CONTROLLER

(71) Applicant: JTEKT CORPORATION, Osaka (JP)

(72) Inventors: Tomohiro Niwa, Okazaki (JP); Junya Honda, Okazaki (JP); Hiroki Maeda, Okazaki (JP)

(73) Assignee: JTEKT CORPORATION, Osaka (JP)

(*) Notice: Subject to any disclaimer, the term of this patent is extended or adjusted under 35 U.S.C. 154(b) by 393 days.

(21) Appl. No.: 17/218,567

(22) Filed: Mar. 31, 2021

(65) Prior Publication Data

US 2021/0313923 A1    Oct. 7, 2021

(30) Foreign Application Priority Data

Apr. 2, 2020 (JP) .................................. 2020-066769

(51) Int. Cl.
| | |
|---|---|
| G05B 5/00 | (2006.01) |
| G05D 23/00 | (2006.01) |
| H02H 7/08 | (2006.01) |
| H02P 29/60 | (2016.01) |
| B62D 5/04 | (2006.01) |
| H05K 7/20 | (2006.01) |
| H02P 23/14 | (2006.01) |
| H02P 25/22 | (2006.01) |

(52) U.S. Cl.
CPC ............ *H02P 29/60* (2016.02); *B62D 5/0463* (2013.01); *B62D 5/0496* (2013.01); *H02P 23/14* (2013.01); *H02P 25/22* (2013.01); *H05K 7/2039* (2013.01)

(58) Field of Classification Search
CPC ...... H02P 29/60; B62D 5/0463; B62D 5/0496
USPC ......................................................... 318/696
See application file for complete search history.

(56) References Cited

U.S. PATENT DOCUMENTS

| | | | |
|---|---|---|---|
| 2011/0101904 A1* | 5/2011 | Sakamoto | ............... H02P 29/64 318/473 |
| 2017/0001661 A1 | 1/2017 | Nakamura | |
| 2018/0219499 A1* | 8/2018 | Kano | .................... H02P 29/032 |
| 2019/0047613 A1* | 2/2019 | Kano | ....................... B62D 6/00 |
| 2019/0256129 A1* | 8/2019 | Oka | ..................... B62D 5/0463 |

FOREIGN PATENT DOCUMENTS

JP    2017-017898 A    1/2017

* cited by examiner

*Primary Examiner* — Erick D Glass
(74) *Attorney, Agent, or Firm* — Oliff PLC

(57) ABSTRACT

A motor controller includes individual drive circuits, a plurality of energization systems, and a processing circuit that outputs a plurality of individual control signals. The processing circuit executes a first calculation process, a second calculation process, a third calculation process, and a fourth calculation process for each of the energization systems. The first calculation process is a process of calculating individual current command values. The second calculation process is a process of calculating the estimated temperatures of protection targets. The third calculation process is a process of calculating individual limit values. The fourth calculation process is a process of calculating the individual control signals based on the individual current command values that are limited by the individual limit values. The processing circuit calculates the estimated temperatures of the protection targets where current of a target system flows.

12 Claims, 6 Drawing Sheets

MOTOR CONTROLLER

CROSS-REFERENCE TO RELATED APPLICATION

This application claims priority to Japanese Patent Application No. 2020-066769 filed on Apr. 2, 2020, incorporated herein by reference in its entirety.

BACKGROUND

1. Technical Field

The present disclosure relates to a motor controller.

2. Description of Related Art

For example, a motor controller that controls a motor including a plurality of coil groups is known as disclosed in Japanese Patent Application Publication No. 2017-17898. The motor controller in JP 2017-17898 A executes overheat protection control. In the overheat protection control, the temperature of protection targets which are targets of overheat protection is estimated, and an upper limit of current supplied to a corresponding energization system is limited based on an estimated temperature. The temperature of the protection targets is estimated based on a substrate temperature of a circuit substrate and the current flowing through the protection target.

SUMMARY

Incidentally, in recent years, the motor controller is required to estimate the temperature of protection targets with more accuracy. The actual situation is that the motor controller with the above configuration is hardly up to the required level. Therefore, inventing a new technique capable of estimating the temperature of protection targets with more accuracy has been demanded.

The present disclosure can accurately estimate the temperature of protection targets.

An aspect of the present disclosure relates to a motor controller. The motor controller controls a motor including a plurality of coil groups. The motor controller includes: individual drive circuits corresponding to the coil groups, respectively; a plurality of energization systems configured to supply drive electric power to the corresponding coil groups; and at least one processing circuit configured to output a plurality of individual control signals that control operation of the individual drive circuits, respectively. The processing circuit is configured to execute a first calculation process, a second calculation process, a third calculation process, and a fourth calculation process for each of the energization systems. The first calculation process is a process of calculating individual current command values that are target values of current supplied to the coil groups. The second calculation process is a process of calculating estimated temperatures of protection targets where the current of the energization systems flows. The third calculation process is a process of calculating individual limit values that are upper limits of the individual current command values based on the estimated temperatures. The fourth calculation process is a process of calculating the individual control signals based on the individual current command values that are limited by the individual limit values. The processing circuit is configured to calculate, in the second calculation process, the estimated temperatures of the protection targets where current of a target system flows, based on a reference temperature detected by a temperature sensor provided in the motor controller, an active change temperature attributed to energization to the target system, and a passive change temperature attributed to energization to another system. The target system is the energization system that causes current to flow to the protection targets that are subjected to calculation of the estimated temperature, the other system being the energization system other than the target system.

With the configuration, the energization systems are apportioned to the coil groups, respectively. Hence, when the motor is driven, the temperature of the protection targets in a target system increases because of reception of heat generated and transmitted by the current flowing to another system, in addition to the heat generated by the current flowing into the target system. In this respect, according to the configuration, the estimated temperatures of the protection targets are calculated in consideration of a passive change temperature attributed to energization to another system in addition to a reference temperature and an active change temperature attributed to energization to the target system. Accordingly, it is possible to accurately estimate the temperature of the protection targets.

In the motor controller, the processing circuit may be configured to calculate, in the second calculation process, a sum of the reference temperature in a present calculation cycle, the active change temperature in the present calculation cycle, and the passive change temperature in the present calculation cycle as the estimated temperatures of the protection targets where the current of the target system flows.

With the configuration, the reference temperature in the present calculation cycle is used. Hence, it is possible to accurately estimate the temperature of the protection targets as compared with the case where, for example, the reference temperature when a start switch of a vehicle is turned on is continuously used in a subsequent calculation cycle.

In the motor controller, the processing circuit may be configured to calculate, in the second calculation process, the active change temperature in the present calculation cycle by using subsequent Expression (1) and calculate the passive change temperature in the present calculation cycle by using subsequent Expression (2):

$$\Delta T\ eax_k = \left(1 x_k^2 \times K\ ax - \Delta T\ eax_{k-1}\right) \times \left(1 - e^{\left(-\frac{t}{\tau ax}\right)}\right) + \Delta T\ eax_{k-1} \quad \text{Expression (1)}$$

where Ix is a current flowing through the target system, Kax is an active change gain set in accordance with the protection targets, τax is a time constant of an active change delay filter that is set in accordance with the protection targets, t is a time interval between the calculation cycles, and $\Delta Teax_{k-1}$ is the active change temperature in a calculation cycle that is one cycle before the present calculation cycle; and $$\Delta T\ epx_k = \left(1 y_k^2 \times K\ px - \Delta T\ epx_{k-1}\right) \times \left(1 - e^{\left(-\frac{t}{\tau px}\right)}\right) + \Delta T\ epx_{k-1} \quad \text{Expression (2)}$$

where Iy is a current flowing through the other system, Kpx is a passive change gain set in accordance with the protection targets, τpx is a time constant of a passive change delay filter that is set in accordance with the protection targets, t is a time interval between the calculation cycles, and $\Delta \text{Tepx}_{k-1}$ is the passive change temperature in a calculation cycle that is one cycle before the present calculation cycle.

According to the configuration, the active change temperature and the passive change temperature are calculated using delay filters. Hence, it is possible to accurately approximate phenomena in which the temperature of the protection targets changes with a time lag from generation of heat.

In the motor controller, the active change gain may be set to a value equal to or more than the passive change gain. In the motor controller, the time constant of the active change delay filter may be set to a value equal to or less than the time constant of the passive change delay filter.

According to each of the configurations, it is possible to accurately approximate the phenomena in which the temperature of the protection targets is changed by receiving the influence of the active change temperature more than the influence of the passive change temperature.

In the motor controller, the processing circuit may be configured to execute a first storage process and a second storage process. The first storage process may be a process of storing the active change temperature when a start switch of a vehicle is turned off as a final active change temperature. The second storage process may be a process of storing the passive change temperature when the start switch is turned off as a final passive change temperature. The processing circuit may be configured to calculate, in the second calculation process when the start switch is turned on, the estimated temperatures of the protection targets by using the final active change temperature as the active change temperature in the calculation cycle one cycle before and using the final passive change temperature as the passive change temperature in the calculation cycle one cycle before.

When the start switch is turned off and then the start switch is again turned on in a short time, it is assumed that the temperatures of the protection targets are kept to be high. In this respect, with the configuration, the active change temperature when the start switch is turned off is stored as a final active change temperature, and the passive change temperature when the start switch is turned off is stored as a final passive change temperature. The estimated temperatures when the start switch is subsequently turned on is calculated by using the final active change temperature as the active change temperature in the calculation cycle one cycle before and the final passive change temperature as the passive change temperature in the calculation cycle one cycle before. Accordingly, when the start switch is turned off and then the start switch is again turned on in a short time, the temperatures of the protection targets can accurately be estimated.

In the motor controller, the processing circuit may include a plurality of individual processing circuits provided for the energization systems, respectively. When abnormality occurs in communication between the individual processing circuits, the individual processing circuits may be configured to continue energization to the energization system corresponding to any one of the individual processing circuits, while stopping energization to the energization system corresponding to another individual processing circuit. In the second calculation process when the start switch is turned off in the state where the abnormality has occurred in the communication between the individual processing circuits and then the start switch is turned on, the other individual processing circuit may be configured to calculate the estimated temperatures of the protection targets by using an alternative temperature that is larger than zero as the passive change temperature in the calculation cycle one cycle before.

As configured above, when abnormality occurs in communication between the individual processing circuits, an individual processing circuit of the energization system where energization is stopped is unable to recognize the current supplied to the energization system where energization is not stopped. Specifically, the individual processing circuit of the energization system where energization is stopped is unable to recognize, at the time of calculating the estimated temperatures of the protection targets, a passive change temperature attributed to energization to the energization system that is another system where energization is not stopped. In this respect, with the above configuration, when the start switch is turned on next time, the estimated temperature of the protection targets of the energization system where energization is stopped is calculated by using an alternative temperature that is larger than zero as the passive change temperature in the calculation cycle one cycle before. Accordingly, when the start switch is turned off and then the start switch is again turned on in a short time, the temperature of the protection targets can accurately be estimated.

The motor controller may further include: the temperature sensors provided for each of the energization systems; and the circuit substrate divided into a plurality of regions. The processing circuit may include a plurality of individual processing circuits provided for the energization systems, respectively. Any one of the energization systems, and the processing circuit and the temperature sensor that correspond to the any one of the energization systems may collectively be mounted on one of the regions.

With the configuration, an energization system and the processing circuit and the temperature sensor corresponding to the energization system are collectively mounted in the same region. Hence, the protection targets corresponding to the energization systems tend to have a temperature change similar to each other. Thus, it becomes easy to set the active change gain, the passive change gain, the time constant of the active change delay filter, and the time constant of the passive change delay filter.

In the motor controller, the energization systems may each include the temperature sensors. With the configuration, since the temperature sensors can be made redundant, the reliability relating to temperature estimation can be enhanced.

In the motor controller, the temperature sensors provided in each of the energization systems may be made by different manufacturers. With the configuration, it is possible to restrain simultaneous failure of a plurality of redundant temperature sensors.

In the motor controller, the protection targets may be provided for each of the energization systems. The protection targets may be disposed so as to release heat to a common heat sink.

With the configuration, the protection targets exert influence of heat on each other through the heat sink. Accordingly, as shown in each of the above configurations, it is very effective to calculate the estimated temperatures of the protection targets in consideration of the passive change temperature in addition to the active change temperature.

In the motor controller, the motor may be configured to apply motor torque to a steering device.

With the configuration, it is possible to accurately estimate the temperatures of the protection targets.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
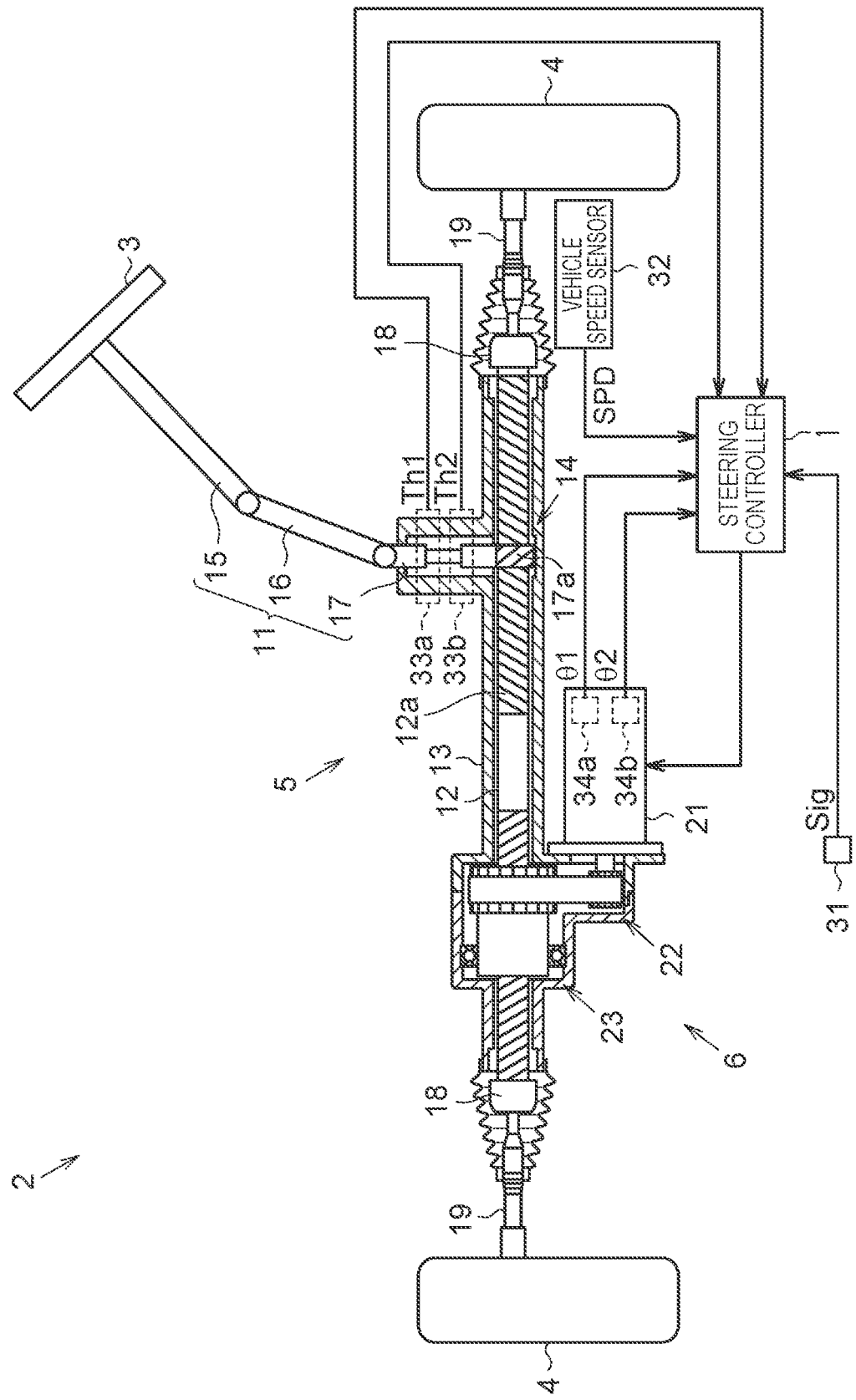
FIG. 1 is a schematic configuration view of an electric power steering device.

Hereinafter, an embodiment of the motor controller will be described based on the drawings. As shown in FIG. 1, a steering device 2 to be controlled by a steering controller 1 that serves as a motor controller is configured as an electric power steering (EPS) device. The steering device 2 includes a steering mechanism 5 that turns turning wheels 4 based on operation of a steering wheel 3 by a driver. The steering device 2 also includes an EPS actuator 6 that applies to the steering mechanism 5 assist force for assisting steering operation.

The steering mechanism 5 includes a steering shaft 11 fixed to the steering wheel 3, a rack shaft 12 coupled to the steering shaft 11, and a rack housing 13 that houses the rack shaft 12 so as to allow reciprocation of the rack shaft 12. The steering mechanism 5 includes a rack and pinion mechanism 14 that converts rotation of the steering shaft 11 into reciprocation of the rack shaft 12. The steering shaft 11 is configured by coupling a column shaft 15, an intermediate shaft 16, and a pinion shaft 17 in order from the position where the steering wheel 3 is located.

The rack shaft 12 and the pinion shaft 17 are disposed at a prescribed crossing angle in the rack housing 13. The rack and pinion mechanism 14 is configured by gearing of a rack tooth 12a formed on the rack shaft 12 and a pinion tooth 17a formed on the pinion shaft 17 with each other. The rack shaft 12 has both ends rotatably coupled with a tie rod 19 through ball joints 18 provided at shaft end portions of the rack shaft 12. The tie rod 19 has its ends coupled with knuckles (not illustrated) attached to the turning wheels 4. Therefore, in the steering device 2, rotation of the steering shaft 11 relating to steering operation is converted into axial movement of the rack shaft 12 by the rack and pinion mechanism 14. The axial movement is transmitted to the knuckles through the tie rod 19, and thereby a turning angle of the turning wheels 4, that is, an advancing direction of a vehicle, is changed.

The EPS actuator 6 includes a motor 21 that is a driving source, a transmission mechanism 22 that transmits rotation of the motor 21, and a conversion mechanism 23 that converts the rotation transmitted via the transmission mechanism 22 into reciprocation of the rack shaft 12. The EPS actuator 6 transmits rotation of the motor 21 to the conversion mechanism 23 via the transmission mechanism 22, and converts the rotation into reciprocation of the rack shaft 12 in the conversion mechanism 23 to apply assist force to the steering mechanism 5. As the motor 21 of the present embodiment, a three-phase surface permanent magnet synchronous motor is adopted, for example. As the transmission mechanism 22, a belt mechanism is adopted, for example. As the conversion mechanism 23, a ball screw mechanism is adopted, for example. The motor 21 is configured as a motor unit integrated with the steering controller 1.

The steering controller 1 receives input of a start signal Sig indicating on-off of a start switch 31 of a vehicle, such as an ignition switch. The steering controller 1 receives input of detection results of various kinds of sensors provided in the vehicle as state quantities indicating a travel state and a steering state. The steering controller 1 controls the motor 21 based on the state quantities. Examples of the various kinds of sensors may include a vehicle speed sensor 32, torque sensors 33a, 33b, and rotational angle sensors 34a, 34b. The vehicle speed sensor 32 detects a vehicle speed SPD. The torque sensors 33a, 33b detect steering torques Th1, Th2 input into the steering mechanism 5, respectively. The torque sensors 33a, 33b are disposed in the pinion shaft 17. When the torque sensors 33a, 33b are normal, the steering torques Th1, Th2 are basically the same values. The rotational angle sensors 34a, 34b detect rotation angles θ1, θ2 of the motor 21 as relative angles in the range of 360 degrees, respectively. When the rotational angle sensors 34a, 34b are normal, the rotation angles θ1,θ2 are basically the same values.

The steering controller 1 controls the operation of the EPS actuator 6, that is, the motor torque to be applied to the steering mechanism 5 to cause reciprocation of the rack shaft 12 by supplying drive electric power to the motor 21 based on each state quantity input from each of the sensors.

Figure 2:
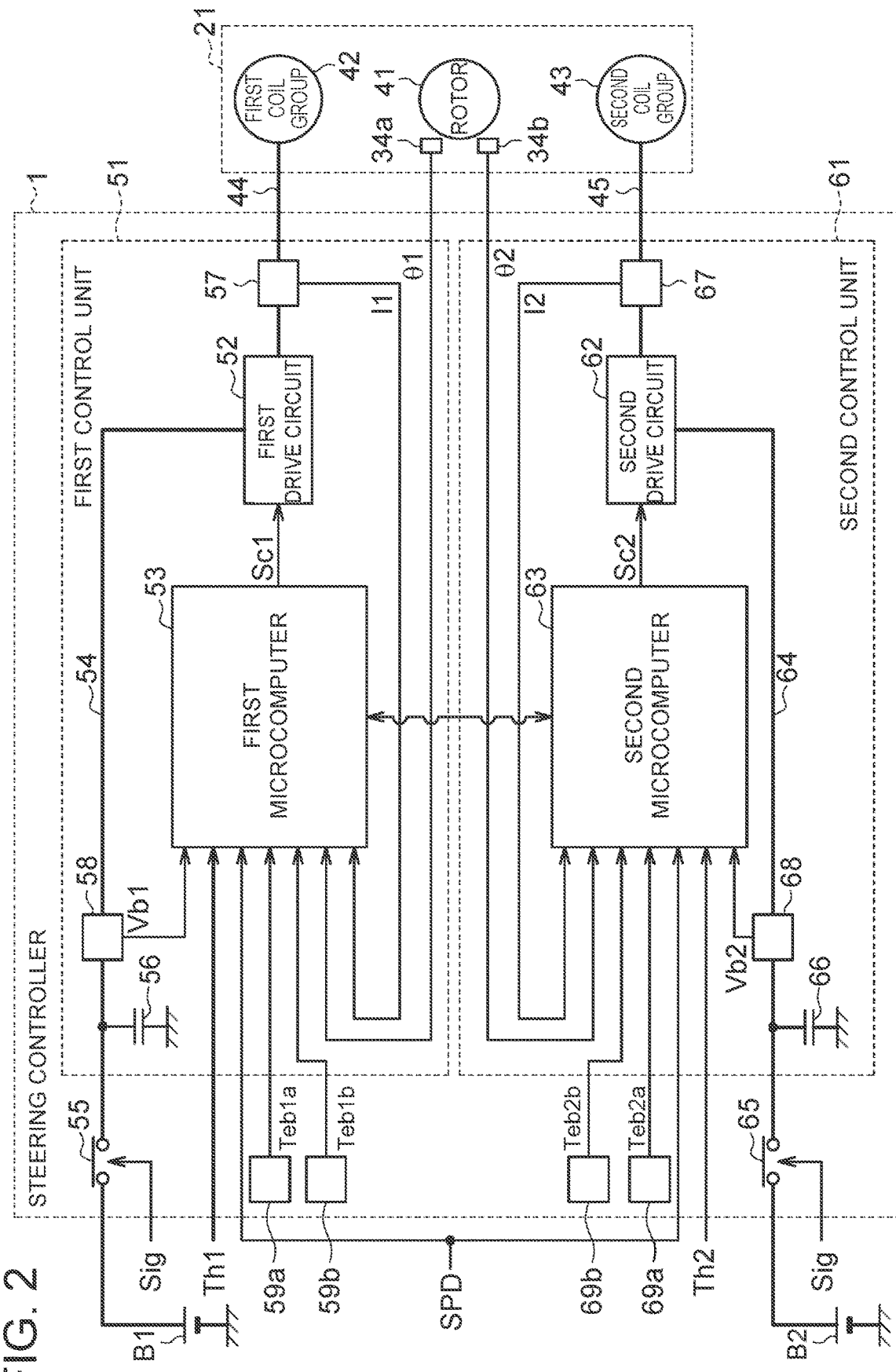
FIG. 2 is a block diagram of a steering controller and a motor.

Next, the configuration of the motor 21 will be described. As shown in FIG. 2, the motor 21 includes a rotor 41, and a first coil group 42 and a second coil group 43 which are wound around stators not illustrated. The first coil group 42 and the second coil group 43 include coils of three phases including U, V, and W phases, respectively. The first coil group 42 is connected to the steering controller 1 via a first connection line 44. The second coil group 43 is connected to the steering controller 1 via a second connection line 45. The first coil group 42 and the second coil group 43 are configured to receive supply of drive electric power independently of each other. In FIG. 2, for convenience of description, the first connection lines 44 corresponding to the respective phases and the second connection lines 45 corresponding to the respective phases are each illustrated as a single component. In the present embodiment, the assist force that the motor 21 is required to generate is obtained by receiving the torque generated by the first coil group 42 and the torque generated by the second coil group 43 at an equal ratio.

Next, the configuration of the steering controller 1 will be described. The steering controller 1 includes a first control unit 51 that controls energization to the first coil group 42, and a second control unit 61 that controls energization to the second coil group 43. The steering controller 1 controls supply of the drive electric power to the first coil group 42 and the second coil group 43 independently. The first control unit 51 and the second control unit 61 each include a central processing unit (CPU) and a memory not illustrated. Various control by the steering controller 1 is executed when the CPU executes programs stored in the memory in every prescribed calculation cycle.

More specifically, the first control unit 51 includes a first drive circuit 52 that is an individual drive circuit and a first microcomputer 53 that is an individual processing circuit. The first drive circuit 52 supplies drive electric power to the first coil group 42. The first microcomputer 53 outputs a first control signal Sc1 that is an individual control signal for controlling operation of the first drive circuit 52.

The first drive circuit 52 is connected to a first in-vehicle power source B1 mounted in the vehicle via a first power source line 54. The first power source line 54 is equipped with a first power source relay 55 that is turned on and off in response to the start signal Sig from the start switch 31. Between the first power source relay 55 in the first power source line 54 and the first drive circuit 52, a first smoothing capacitor 56 is connected for smoothing current. When the first power source relay 55 is put in an ON state and the first power source line 54 becomes conductive, the first drive circuit 52 can supply to the first coil group 42 the drive electric power based on the source voltage of the first in-vehicle power source B1. The first energization system that supplies drive electric power to the first coil group 42 includes several kinds of components, such as the first drive circuit 52, the first power source line 54, and the first smoothing capacitor 56, provided between the first in-vehicle power source B1 and the first coil group 42.

As the first drive circuit 52, a well-known PWM inverter having a plurality of switching elements 52a to 52f, such as FETs, is adopted, for example. The first control signal Sc1 is a gate on-off signal that defines an on-off state of each of the switching elements 52a to 52f. The first drive circuit 52 converts a direct-current electric power supplied from the first in-vehicle power source B1 into three-phase alternating-current electric power by turning on and off the switching elements 52a to 52f in response to the first control signal Sc1, and supplies the converted electric current to the first coil group 42 via the first connection line 44. Accordingly, the first control unit 51 controls the torque generated in the first coil group 42 through supply of the drive electric power to the first coil group 42.

The first microcomputer 53 is connected to a first electric current sensor 57, a first voltage sensor 58, and first temperature sensors 59a, 59b. The first electric current sensor 57 detects an actual current value I1 of each phase of the current flowing through the first connection line 44. As the first electric current sensor 57, a sensor that detects the actual current value I1 based on voltage drop in a shunt resistor may be adopted, for example. The first voltage sensor 58 detects the voltage of the first power source line 54, that is, a source voltage Vb1 of the first in-vehicle power source B1. The first temperature sensor 59a detects a substrate temperature Teb1a of a circuit substrate on which the first microcomputer 53 is mounted. The first temperature sensor 59b detects a substrate temperature Teb1b of a circuit substrate on which the first microcomputer 53 is mounted. In short, the steering controller 1 includes two temperature sensors corresponding to the first energization system. The substrate temperatures Teb1a, Teb1b are basically the same values when the first temperature sensors 59a, 59b are normal. As the first temperature sensors 59a, 59b, sensors made by different manufacturers, or sensors made in different factories of the same manufacturer are adopted, for example.

The second control unit 61 is basically configured in a similar manner to the first control unit 51. The second control unit 61 includes a second drive circuit 62 that is an individual drive circuit, and a second microcomputer 63 that is an individual processing circuit. The second drive circuit 62 supplies drive electric power to the second coil group 43. The second microcomputer 63 outputs a second control signal Sc2 that is an individual control signal for controlling operation of the second drive circuit 62.

The second drive circuit 62 is connected to a second in-vehicle power source B2 mounted in the vehicle via a second power source line 64. Like the first power source line 54, the second power source line 64 is equipped with a second power source relay 65 that is turned on and off in response to the start signal Sig from the start switch 31. Between the second power source relay 65 in the second power source line 64 and the second drive circuit 62, a second smoothing capacitor 66 is connected. When the second power source relay 65 is put in an ON state and the second power source line 64 becomes conductive, the second drive circuit 62 can supply to the second coil group 43 the drive electric power based on the source voltage of the second in-vehicle power source B2. The second energization system that supplies drive electric power to the second coil group 43 includes several kinds of components, such as the second drive circuit 62, the second power source line 64, and the second smoothing capacitor 66, provided between the second in-vehicle power source B2 and the second coil group 43.

As the second drive circuit 62, a well-known PWM inverter is adopted as in the case of the first drive circuit 52. The second control signal Sc2 is a gate on-off signal that defines an on-off state of each of the switching elements 62a to 62f composing the second drive circuit 62. The second drive circuit 62 converts a direct-current electric power supplied from the second in-vehicle power source B2 into a three-phase alternating-current electric power by turning on and off the switching elements 62a to 62f in response to the second control signal Sc2, and supplies the converted electric power to the second coil group 43 via the second connection line 45. Accordingly, the second control unit 61 controls the torque generated in the second coil group 43 through supply of the drive electric power to the second coil group 43.

The second microcomputer 63 is connected to a second electric current sensor 67, a second voltage sensor 68, and second temperature sensors 69a, 69b. The second electric current sensor 67 detects an actual current value I2 of each phase of the current flowing through the second connection line 45. As the second electric current sensor 67, a sensor that detects the actual current value I2 based on voltage drop in a shunt resistor may be adopted, for example. The second voltage sensor 68 detects the voltage of the second power source line 64, that is, a source voltage Vb2 of the second in-vehicle power source B2. The second temperature sensor 69a detects a substrate temperature Teb2a of a circuit substrate on which the second microcomputer 63 is mounted. The second temperature sensor 69b detects a substrate temperature Teb2b of a circuit substrate on which the second microcomputer 63 is mounted. In short, the steering controller 1 includes two temperature sensors corresponding to the second energization system. The substrate temperatures Teb2a, Teb2b are basically the same values when the second temperature sensors 69a, 69b are normal. As the second temperature sensors 69a, 69b, sensors made by different manufacturers, or sensors made in different factories of the same manufacturer are adopted, for example.

Figure 3:
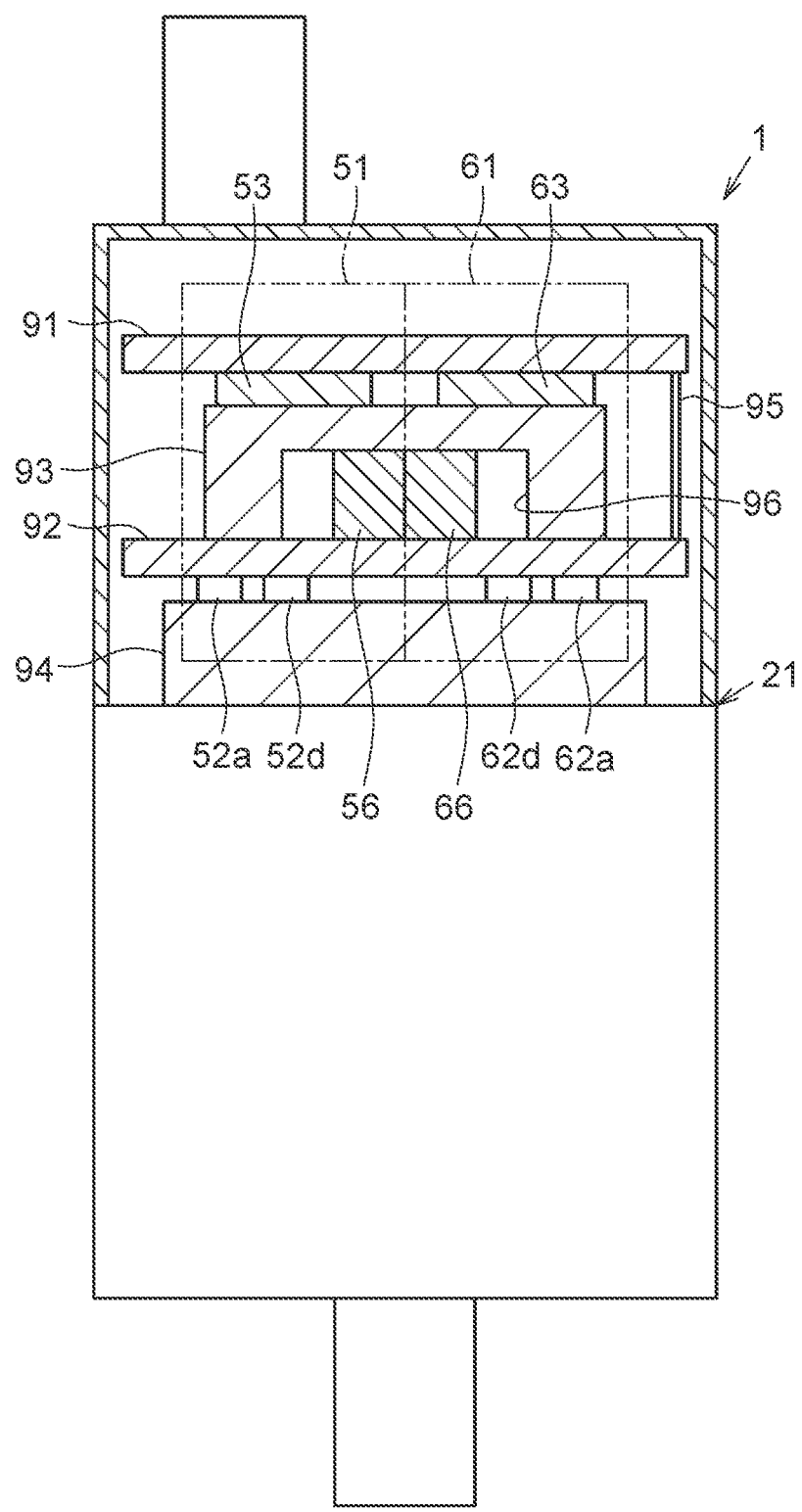
FIG. 3 is a partial sectional view showing sectional structure of the steering controller in a motor unit.

Next, a mechanical configuration of the motor unit will be described. As shown in FIG. 3, the steering controller 1 is attached integrally to the motor 21. The steering controller 1 includes a control circuit substrate 91, a drive circuit substrate 92, a first heat sink 93, and a second heat sink 94. The control circuit substrate 91 and the drive circuit substrate 92 are connected to each other via a bus bar 95.

Figure 4:
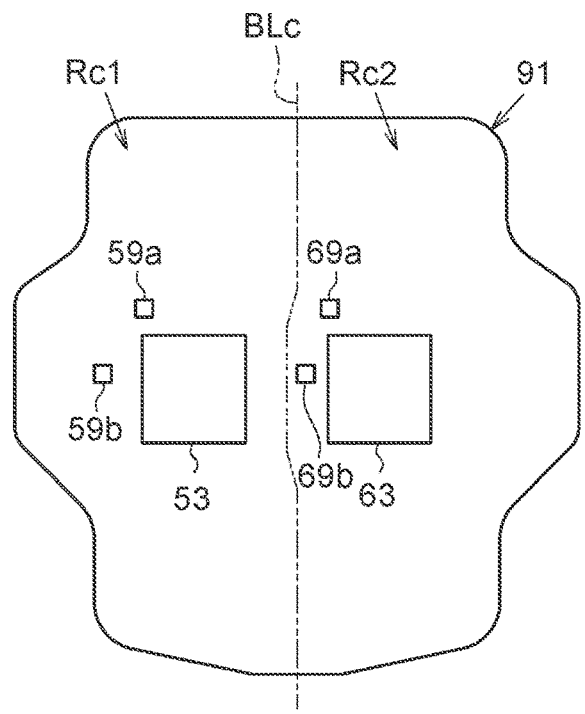
FIG. 4 is a plan view of a control circuit substrate.

As shown in FIGS. 3 and 4, various circuit elements including the first microcomputer 53, the second microcomputer 63, the first temperature sensors 59a, 59b, and the second temperature sensors 69a, 69b are mounted on the control circuit substrate 91.

More specifically, the control circuit substrate 91 is divided into two regions at an approximately central position by a boundary line BLc shown with a two-dot chain line. In the present embodiment, in the control circuit substrate 91, a left region of the boundary line BLc is a first region Rc1 corresponding to the first energization system, and a right region of the boundary line BLc is a second region Rc2 corresponding to the second energization system. In the first region Rc1, the first microcomputer 53 and the first temperature sensors 59a, 59b are mounted on a mounting surface of the control circuit substrate 91 on the side where the drive circuit substrate 92 is disposed. In the second region Rc2, the second microcomputer 63 and the second temperature sensors 69a, 69b are mounted on a mounting surface of the control circuit substrate 91 on the side where the drive circuit substrate 92 is disposed.

Figure 5:
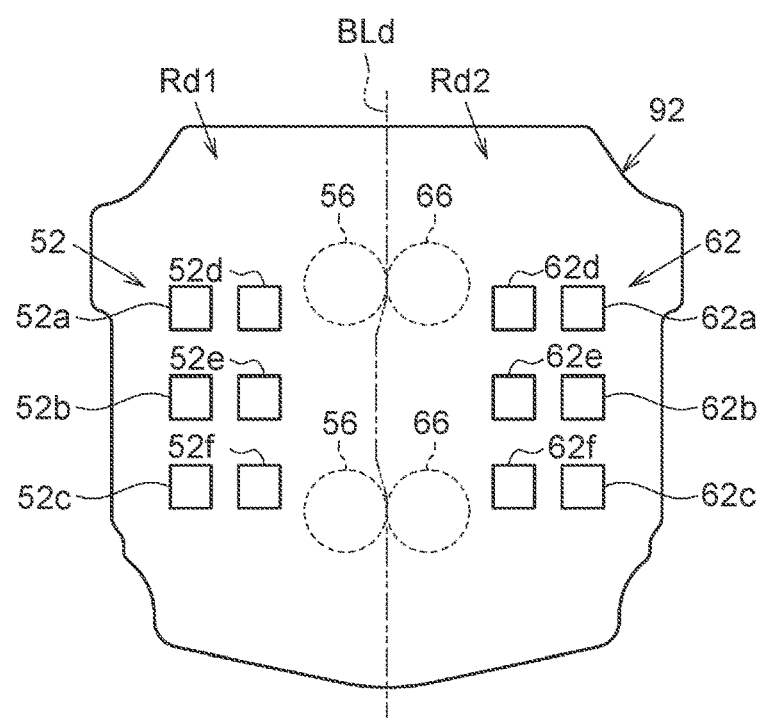
FIG. 5 is a plan view of a drive circuit substrate.

As shown in FIGS. 3 and 5, various circuit elements including the first drive circuit 52, the first smoothing capacitor 56, the second drive circuit 62, and the second smoothing capacitor 66 are mounted on the drive circuit substrate 92.

More specifically, the drive circuit substrate 92 is divided into two regions at an approximately central position by a boundary line BLd shown with a two-dot chain line. The boundary line BLd approximately coincides with the boundary line BLc which divides the control circuit substrate 91. In the present embodiment, in the drive circuit substrate 92, a left region of the boundary line BLd is a first region Rd1 corresponding to the first energization system, and a right region of the boundary line BLd is a second region Rd2 corresponding to the second energization system. In the first region Rd1, the first smoothing capacitor 56 is mounted on a mounting surface of the drive circuit substrate 92 on the side where the control circuit substrate 91 is disposed. In the first region Rd1, the first drive circuit 52, that is, the switching elements 52a to 52f, are mounted on a mounting surface of the drive circuit substrate 92 on the side opposite to the side where the control circuit substrate 91 is disposed. In the second region Rd2, the second smoothing capacitor 66 is mounted on a mounting surface of the drive circuit substrate 92 on the side where the control circuit substrate 91 is disposed. In the second region Rd2, the second drive circuit 62, that is, the switching elements 62a to 62f, are mounted on a mounting surface of the drive circuit substrate 92 on the side opposite to the side where the control circuit substrate 91 is disposed.

As shown in FIGS. 3 to 5, the control circuit substrate 91 and the drive circuit substrate 92 are divided by the approximately identical boundary lines BLc, BLd. Hence, approximately the entire first region Rc1 of the control circuit substrate 91 overlaps with the first region Rd1 of the drive circuit substrate 92 in an axial direction, and approximately the entire second region Rc2 of the control circuit substrate 91 overlaps with the second region Rd2 of the drive circuit substrate 92 in the axial direction. Therefore, the first drive circuit 52 and the first smoothing capacitor 56 that constitute the first energization system, and the first microcomputer 53 and the first temperature sensors 59a, 59b corresponding to the first energization system are collectively mounted on the first regions Rc1, Rd1. The second drive circuit 62, the second power source line 64, and the second smoothing capacitor 66 that constitute the second energization system, and the second microcomputer 63 and the second temperature sensors 69a, 69b corresponding to the second energization system are also collectively mounted on the second regions Rc2, Rd2.

As shown in FIG. 3, the first heat sink 93 is disposed between the control circuit substrate 91 and the drive circuit substrate 92. The first heat sink 93 is in contact with the first microcomputer 53 and the second microcomputer 63 via a heat release grease not illustrated. Accordingly, both the heat of the first microcomputer 53 and the heat of the second microcomputer 63 are released to the first heat sink 93.

The first heat sink 93 also has a recess portion 96 open to the side where the drive circuit substrate 92 is disposed. The recess portion 96 houses the first smoothing capacitor 56 and the second smoothing capacitor 66 mounted on the drive circuit substrate 92. The first smoothing capacitor 56 and the second smoothing capacitor 66 are in contact with the first heat sink 93 via the heat release grease. Accordingly, both the heat of the first smoothing capacitor 56 and the heat of the second smoothing capacitor 66 are released to the first heat sink 93.

The second heat sink 94 is disposed on the drive circuit substrate 92 on the side opposite to the control circuit substrate 91. The second heat sink 94 is in contact with the first drive circuit 52 and the second drive circuit 62 via a heat release grease. Accordingly, both the heat of the first drive circuit 52 and the heat of the second drive circuit 62 are released to the second heat sink 94.

Next, the configuration of the first microcomputer 53 and the second microcomputer 63 will be described. By executing calculation processes shown in following control blocks in every prescribed calculation cycle, the first microcomputer 53 and the second microcomputer 63 calculate the first control signal Sc1 and the second control signal Sc2, respectively.

As shown in FIG. 2, the first microcomputer 53 receives input of a vehicle speed SPD, a steering torque Th1, a rotation angle θ1, an actual current value I1, a source voltage Vb1, and substrate temperatures Teb1a, Teb1b. The first microcomputer 53 outputs a first control signal Sc1 based on the state quantities. The second microcomputer 63 receives input of a vehicle speed SPD, a steering torque Th2, a rotation angle θ2, an actual current value I2, a source voltage Vb2, and substrate temperatures Teb2a, Teb2b. The second microcomputer 63 outputs a second control signal Sc2 based on the state quantities.

Figure 6:
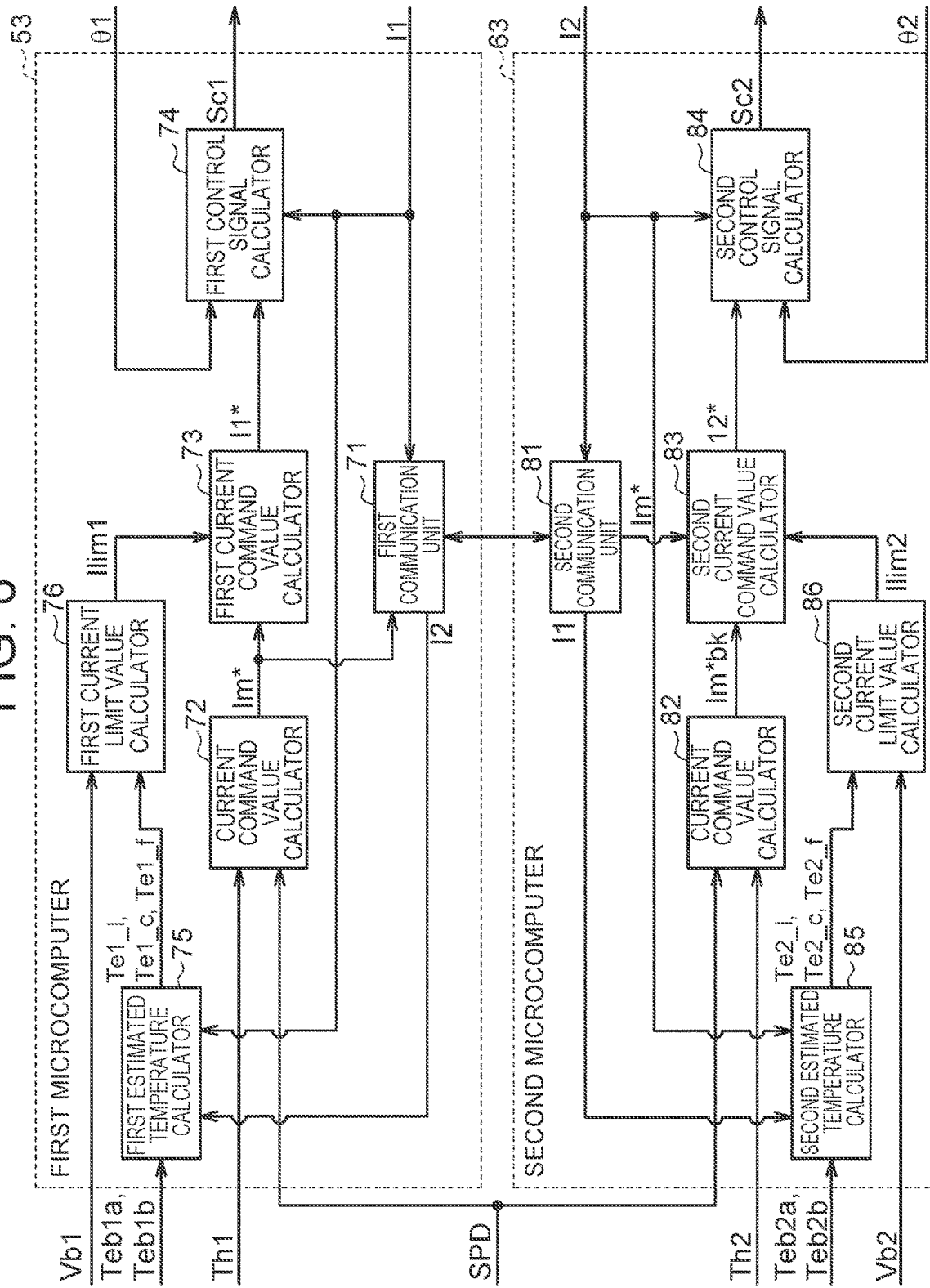
FIG. 6 is a block diagram of a first microcomputer and a second microcomputer.

More specifically, as shown in FIG. 6, the first microcomputer 53 includes a first communication unit 71 that communicates with the second microcomputer 63. The first microcomputer 53 also includes a current command value calculator 72 that calculates a current command value Im*, a first current command value calculator 73 that calculates a first current command value I1* that is an individual current command value, and a first control signal calculator 74 that calculates a first control signal Sc1. The first current command value calculator 73 executes an individual current command value calculation process, and the first control signal calculator 74 executes an individual control signal calculation process. The first microcomputer 53 further includes a first estimated temperature calculator 75 that calculates estimated temperatures Te1_l, Te1_c, Te1_f, of the first coil group 42, the first drive circuit 52, and the first smoothing capacitor 56 which are protection targets. The first microcomputer 53 also includes a first current limit value calculator 76 that calculates an upper limit of the first current command value I1*, i.e., a first current limit value Ilim1 that is an individual current limit value. The first estimated temperature calculator 75 executes an estimated temperature calculation process, and the first current limit value calculator 76 executes an individual current limit value calculation process.

The first communication unit 71 performs exchange of various signals between each calculator in the first microcomputer 53 and the second communication unit 81 of the second microcomputer 63 as will be described later. Specifically, the first communication unit 71 transmits to the second communication unit 81 a current command value Im* and an actual current value I1 supplied to the first coil group 42. The first communication unit 71 receives an actual current value I2 supplied to the second coil group 43 from the second communication unit 81, and outputs the actual current value I2 to the first estimated temperature calculator 75.

The current command value calculator 72 receives input of a steering torque Th1 and a vehicle speed SPD. The current command value calculator 72 calculates the current command value Im* based on these state quantities. The current command value Im* indicates the current corresponding to the torque to be generated in the entire motor 21. Specifically, the current command value calculator 72 calculates the current command value Im* which has a larger absolute value, as the absolute value of the steering torque Th1 becomes larger, and the vehicle speed SPD becomes lower. The current command value Im* calculated in this way is output to the first current command value calculator 73 and the second microcomputer 63 via the first communication unit 71. As will be described later in detail, the current command value Im* is reduced into half in each of the first current command value calculator 73 and the second microcomputer 63, and is used for current control.

The first current limit value calculator 76 receives input of the source voltage Vb1 and the estimated temperatures Te1_l, Te1_c, Te1_f calculated in the first estimated temperature calculator 75 as will be described later. The first current limit value calculator 76 calculates a current limit value Ilim1_v based on the source voltage Vb1, a current limit value Ilim1_l based on the estimated temperature Te1_l, a current limit value Ilim1_c based on the estimated temperature Te1_c, and a current limit value Ilim1_f based on the estimated temperature Te1_f. Among the current limit values Ilim1_v, Ilim1_l, Ilim1_c, Ilim1_f, the smallest value is calculated as the first current limit value Ilim1.

Figure 7:
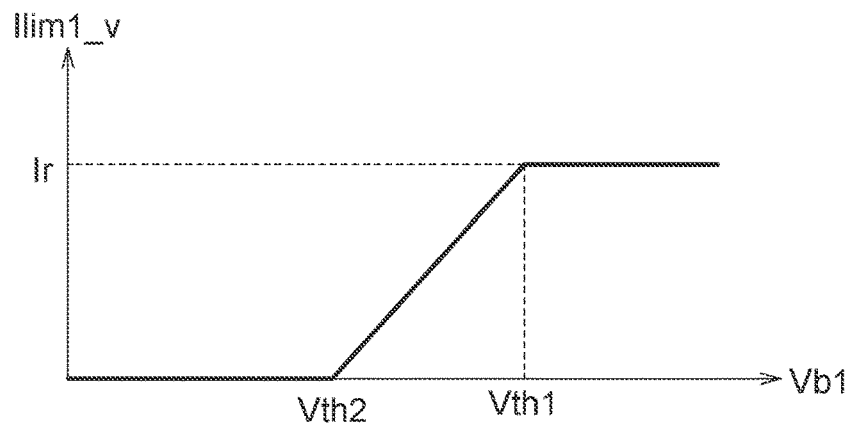
FIG. 7 is a graph showing the relationship between source voltage and a current limit value.

Specifically, as shown in FIG. 7, the first current limit value calculator 76 includes a map which defines the relationship between the source voltage Vb1 and the current limit value Ilim1_v. The first current limit value calculator 76 calculates the current limit value Ilim1_v corresponding to the source voltage Vb1 with reference to the map.

According to the map, when the source voltage Vb1 is larger than a first voltage threshold Vth1, the current limit value Ilim1_v becomes a constant value that is equal to a rated current Ir. In other words, the current limit value Ilim1_v is a value which does not limit the current supplied to the first coil group 42. When the source voltage Vb1 is equal to or less than the first voltage threshold Vth1, the current limit value Ilim1_v becomes smaller based on drop of the source voltage Vb1. When the value of the source voltage Vb1 is equal to or less than a second voltage threshold Vth2, the current supplied to the first coil group 42 is limited to zero.

Figure 8:
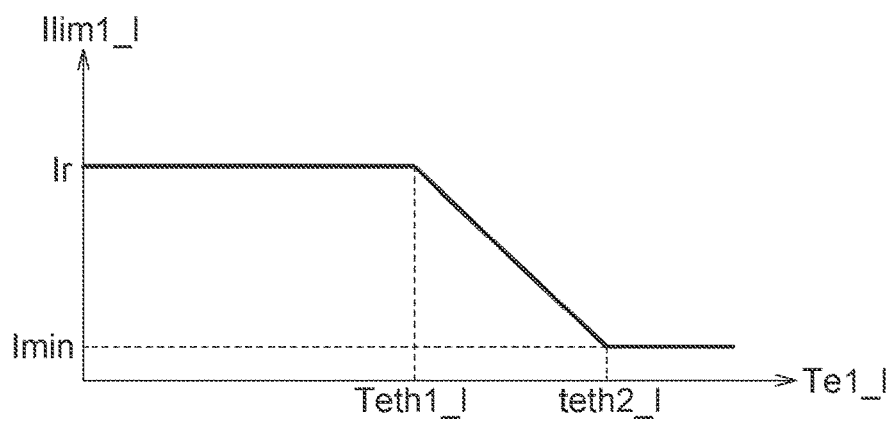
FIG. 8 is a graph showing the relationship between estimated temperature and the current limit value.

As shown in FIG. 8, the first current limit value calculator 76 includes a map which defines the relationship between the estimated temperature Te1_l and the current limit value Ilim1_l. The first current limit value calculator 76 calculates the current limit value Ilim1_l corresponding to the estimated temperature Te1_l with reference to the map.

According to the map, when the estimated temperature Te1_l is equal to or less than a first temperature threshold Teth1_l, the current limit value Ilim1_l becomes a constant value that is equal to the rated current Ir. In other words, the current limit value Ilim1_l is a value which does not limit the current supplied to the first coil group 42. When the estimated temperature Te1_l is larger than the first temperature threshold Teth1_l, the current limit value Ilim1_l becomes smaller as the estimated temperature Te1_l is larger. When the value of the estimated temperature Te1_l is equal to or more than a second temperature threshold Teth2_l, the current supplied to the first coil group 42 is limited to a minimum current value Imin. The minimum current value Imin is set to be a value which does not cause temperature to increase in the steering controller 1 and the motor 21 even when the current of the value is supplied to the first coil group 42.

The first current limit value calculator 76 includes a map which sets the relationship between the estimated temperature Te1_c and the current limit value Ilim1_c and a map which sets the relationship between the estimated temperature Te1_f and the current limit value Ilim1_f. Since these maps each have the same tendency as the map shown in FIG. 8, the description thereof is omitted. With reference to these maps, the first current limit value calculator 76 calculates the current limit value Ilim1_c corresponding to the estimated temperature Te1_c, and the current limit value Ilim1_f corresponding to the estimated temperature Te1_f.

As shown in FIG. 6, the first current limit value calculator 76 calculates as the first current limit value Ilim1 the smallest value among the current limit values Ilim1_v, Ilim1_l, Ilim1_c, Ilim1_f. The first current limit value Ilim1 calculated in this way is output to the first current command value calculator 73.

The first current command value calculator 73 receives input of the current command value Im* and the first current limit value Ilim1. The first current command value calculator 73 calculates a first current command value I1* based on these state quantities. The first current command value I1* indicates the current to be fed to the first coil group 42 for generating the torque corresponding to the current command value Im* in the motor 21.

Specifically, when a value half of the current command value Im* is equal to or less than the first current limit value Ilim1, the first current command value calculator 73 calculates the half value as the first current command value I1*. Meanwhile, when the value half of the current command value Im* is larger than the first current limit value Ilim1, the first current command value calculator 73 calculates the first current limit value Ilim1 as the first current command value I1*.

The first control signal calculator 74 receives input of the first current command value I1*, the actual current value I1, and the rotation angle θ1. The first control signal calculator 74 calculates a first control signal Sc1 by executing vector control based on the actual current value I1, the first current command value I1*, and the rotation angle θ1 so as to cause the actual current value I1 to follow the first current command value I1*. When the first control signal Sc1 calculated in this way is output to the first drive circuit 52, the drive electric power corresponding to the first control signal Sc1 is supplied to the first coil group 42. Accordingly, the torque indicated by the first current command value I1* is generated in the first coil group 42.

The first current command value I1* is a vector command value composed of a d-axis current command value Id1* and a q-axis current command value Iq1*. The actual current value I1 is a vector value composed of a d-axis electric current value Id1 and a q-axis electric current value Iq1. Normally, a value zero is substituted into the d-axis current command value Id1*, and the first current command value I1* is substituted into the q-axis current command value Iq1*. Since vector control of the three-phase motor is well-known art, detailed description thereof is omitted. The relationship of following Expression (3) is established between the actual current value I1, and the d-axis current command value Id1 and the q-axis current command value Iq1.

$$I1^2 = Id1^2 + Iq1^2 \qquad \text{Expression(3)}$$

The second microcomputer 63 is basically configured in a similar manner to the first microcomputer 53. More specifically, the second microcomputer 63 includes the second communication unit 81 that exchanges various signals with the first communication unit 71. The second microcomputer 63 also includes a current command value calculator 82 that calculates a current command value Im*bk for backup, a second current command value calculator 83 that calculates a second current command value I2* that is an individual current command value, and a second control signal calculator 84 that calculates a second control signal Sc2. The second current command value calculator 83 executes an individual current command value calculation process, and the second control signal calculator 84 executes an individual control signal calculation process. The second microcomputer 63 further includes a second estimated temperature calculator 85 that calculates estimated temperatures Te2_l, Te2_c, Te2_f of the second coil group 43, the second drive circuit 62, and the second smoothing capacitor 66 which are protection targets. The second microcomputer 63 also includes a second current limit value calculator 86 that calculates an upper limit of the second current command value I2*, i.e., a second current limit value Ilim2 that is an individual current limit value. The second estimated temperature calculator 85 executes an estimated temperature calculation process, and the second current limit value calculator 86 executes an individual current limit value calculation.

The second communication unit 81 performs exchange of various signals between each calculator in the second microcomputer 63 and the first communication unit 71. Specifically, the second communication unit 81 transmits to the first communication unit 71 an actual current value I2 supplied to the second coil group 43. The second communication unit 81 also receives the current command value Im* from the first communication unit 71, and outputs the current command value Im* to the second current command value calculator 83. The second communication unit 81 further receives the actual current value I1 supplied to the first coil group 42 from the first communication unit 71, and outputs the actual current value I1 to the second estimated temperature calculator 85.

The current command value calculator 82 receives input of the steering torque Th2 and the vehicle speed SPD. The current command value calculator 82 calculates the current command value Im*bk for backup by the same calculation process as in the current command value calculator 72 of the first microcomputer 53.

The second current limit value calculator 86 receives input of the source voltage Vb2 and the estimated temperatures Te2_l, Te2_c, Te2_f calculated in the second estimated temperature calculator 85 as will be described later. The second current limit value calculator 86, like the first current limit value calculator 76, calculates a current limit value Ilim2_v based on the source voltage Vb2, a current limit value Ilim2_l based on the estimated temperature Te2_l, a current limit value Ilim2_c based on the estimated temperature Te2_c, and a current limit value Ilim2_f based on the estimated temperature Te2_f. Among the current limit values Ilim2_v, Ilim2_l, Ilim2_c, Ilim2_f, the smallest value is calculated as a second current limit value Ilim2.

The second current command value calculator 83 receives input of the current command value Im* via the second communication unit 81, and also the current command value Im*bk for backup. The second current command value I2* indicates the current to be fed to the second coil group 43 for generating the torque corresponding to the current command value Im* in the motor 21. When the current command value Im* is input into the second current command value calculator 83 via the second communication unit 81, the second current command value calculator 83 does not use the current command value Im*bk for backup.

The second current command value calculator 83 calculates the current command value I2* based on the current command value Im*. Specifically, when a value half of the current command value Im* is equal to or less than the second current limit value Ilim2, the second current command value calculator 83 calculates the half value as the second current command value I2*. Meanwhile, when the value half of the current command value Im* is larger than the second current limit value Ilim2, the second current command value calculator 83 calculates the second current limit value Ilim2 as the second current command value I2*. When the current command value Im* is not input into the second current command value calculator 83, the second current command value calculator 83 calculates the second current command value I2* based on the current command value Im*bk for backup in a similar manner.

When abnormality occurs in inter-microcomputer communication between the first microcomputer 53 and the second microcomputer 63, the second current command value calculator 83 calculates the second current command value I2* as zero even with the first microcomputer 53 being in operation. As a consequence, energization to the second coil group 43 is stopped. The second microcomputer 63 determines occurrence of abnormality in the inter-microcomputer communication when the second communication unit 81 fails to receive a signal indicating a normal communication state from the first communication unit 71, or when the second communication unit 81 receives a signal indicating an abnormal communication state.

The second control signal calculator 84 receives input of the second current command value I2*, the actual current value I2, and the rotation angle θ2. The second control signal calculator 84 calculates the second control signal Sc2 by the same calculation process as in the first control signal calculator 74. When the second control signal Sc2 calculated in this way is output to the second drive circuit 62, the drive electric power corresponding to the second control signal Sc2 is supplied to the second coil group 43. Accordingly, the torque indicated by the second current command value I2* is generated in the second coil group 43.

Next, calculation of the estimated temperatures Te1_l, Te1_c, Te1_f by the first estimated temperature calculator 75 will be described. Since the calculation methods of the estimated temperatures Te1_l, Te1_c, Te1_f are basically the same, calculation of the estimated temperature Te1_l of the first coil group 42 will be described as an example.

Here, when the motor 21 is driven, the temperature of the first coil group 42 increases due to generation of heat attributed to the current flowing to the first energization system, and also due to reception of heat generated and transmitted due to the current flowing to the second energization system, such as the heat generated in the second coil group 43. Based on this point, the first estimated temperature calculator 75 calculates the estimated temperature Te1_l of the first coil group 42 in consideration of a passive change temperature ΔTep1_l attributed to energization to the second energization system which is another system, in addition to substrate temperatures Teb1a, Teb1b and an active change temperature ΔTea1_l attributed to energization to the first energization system which is the target system.

More specifically, the first estimated temperature calculator 75 receives input of the actual current value I2 via the first communication unit 71, in addition to the substrate temperatures Teb1a, Teb1b, and the actual current value I1. The first estimated temperature calculator 75 selects the higher one of the substrate temperature Teb1a and the substrate temperature Teb1b as the substrate temperature Teb1 that is a reference temperature. Then, the first estimated temperature calculator 75 calculates the estimated temperature Te1_l of the first coil group 42 as a sum of the substrate temperature Teb1, the active change temperature ΔTea1_l of the first coil group 42, and the passive change temperature ΔTep1_l of the first coil group 42, as expressed by following Expression (4):

$$Te1\_l = Teb1 + \Delta Tea1\_l + \Delta Tep1\_l \qquad \text{Expression (4)}$$

Figure 9:
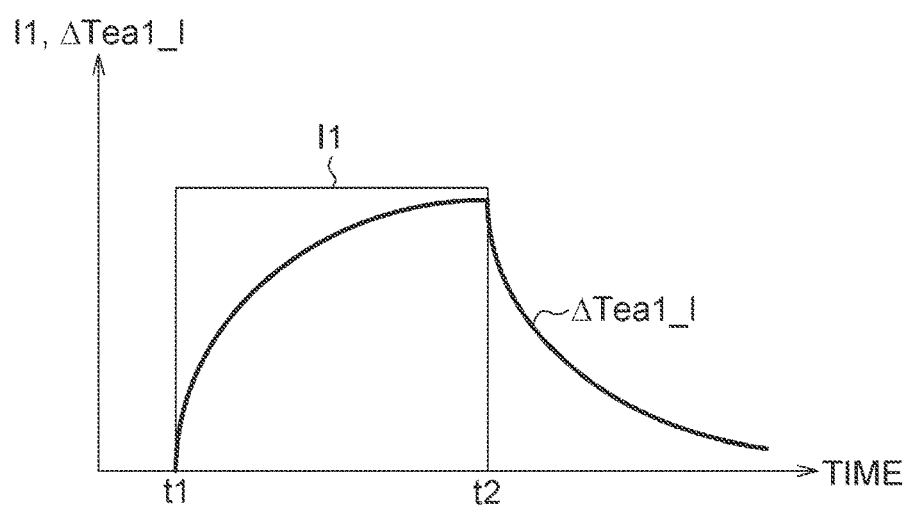
FIG. 9 is a graph showing temporal change of current and active change temperature.

Here, as shown in FIG. 9 for example, when the actual current value I1 of the current flowing to the first energization system increases stepwise at time t1, the active change temperature ΔTea1_l increases with a tendency of primary delay in relation with generation of heat in the first coil group 42. When the actual current value I1 of the current flowing to the first coil group 42 decreases to zero at time t2, the active change temperature ΔTea1_l decreases with a tendency of primary delay in relation with release of heat from the first coil group 42. In FIG. 9, the current is expressed with a thin line, while the active change temperature ΔTea1_l is expressed with a thick line. Similarly, the passive change temperature ΔTep1_l changes with a tendency of primary delay with respect to change of the actual current value I2 of the current flowing through the second energization system.

To reflect such characteristics, the first estimated temperature calculator 75 calculates an active change temperature $\Delta Tea1\_l_k$ in a present calculation cycle by using following Expression (5) including a primary delay filter. A subscript added to a reference mark of each state quantity indicates the calculation cycle of each state quantity, with the present calculation cycle used as a reference being expressed as "k".

$$\Delta T\, ea1\_l_k = \qquad \text{Expression (5)}$$
$$\left(I1_k^2 \times Ka1\_l - \Delta T\, ea1\_l_{k-1}\right) \times \left(1 - e^{\left(-\frac{t}{\tau a1\_l}\right)}\right) + \Delta T\, ea1\_l_{k-1}$$

In Expression (5), "Ka1_l" indicates an active change gain set in accordance with the first coil group 42, "τa1_l" indicates a time constant of an active change delay filter set in accordance with the first coil group 42, and "t" indicates a time interval between the calculation cycles.

The first estimated temperature calculator 75 calculates a passive change temperature $\Delta Tea1\_l_k$ in the present calculation cycle by using following Expression (6) including a primary delay filter.

$$\Delta T\, ep1\_l_k = \qquad \text{Expression (6)}$$
$$\left(I2_k^2 \times Kp1\_l - \Delta T\, ep1\_l_{k-1}\right) \times \left(1 - e^{\left(-\frac{t}{\tau p1\_l}\right)}\right) -$$
$$\Delta T\, ep1\_l_{k-1}$$

In Expression (6), "Kp1_l" indicates a passive change gain set in accordance with the first coil group 42, "τp1_l" indicates a time constant of a passive change delay filter set in accordance with the first coil group 42, and "t" indicates a time interval between the calculation cycles.

The active change gain Ka1_l and the time constant τp1_l are set in advance based on the result of an experiment of measuring the temperature of the first coil group 42 in the state where energization to the first energization system is performed while energization to the second energization system is stopped, or the like. The passive change gain Kp1_l and the time constant τp1_l are set in advance based on the result of an experiment of measuring the temperature of the first coil group 42 in the state where energization to the first energization system is stopped while energization to the second energization system is performed, or the like. In the present embodiment, the active change gain Ka1_l is set to a value equal to or more than the passive change gain Kp1_l, and the time constant τa1_l is set to a value equal to or less than the time constant τp1_l.

The first estimated temperature calculator 75 sets the actual current value I2 to zero, when abnormality occurs in the inter-microcomputer communication as described before and thereby energization to the second energization system is stopped. More specifically, when abnormality occurs in the inter-microcomputer communication and thereby energization to the second energization system is stopped, the first estimated temperature calculator 75 calculates the estimated temperature Te1_l by setting the passive change temperature ΔTep1_l of the first coil group 42 to zero.

Here, in the calculation of the estimated temperature Te1_c of the first smoothing capacitor 56, an active change gain Ka1_c, a passive change gain Kp1_c, and time constants τa1_c, τp1_c set in accordance with the first smoothing capacitor 56 are used when Expressions (5) and (6) are applied. In the calculation of the estimated temperature Te1_f of the first drive circuit 52, an active change gain Ka1_f, a passive change gain Kp1_f, and time constants τa1_l, τp1_f set in accordance with the first drive circuit 52 are used when expressions (5) and (6) are applied. In the present embodiment, the estimated temperature of a switching element disposed in the location where temperature most easily increases, among the switching elements constituting the first drive circuit 52, is adopted as the estimated temperature Te1_f of the first drive circuit 52.

The second estimated temperature calculator 85 selects the higher one of the substrate temperatures Teb2a and the substrate temperature Teb2b as the substrate temperature Teb2 that is a reference temperature. Calculation of the estimated temperatures $Te2\_l$, $Te2\_c$, $Te2\_f$ by the second estimated temperature calculator 85 is the same as the calculation of the estimated temperatures $Te1\_l$, $Te1\_c$, $Te1\_f$ by the first estimated temperature calculator 75 except that the first energization system is another system and the second energization system is the target system.

Next, the calculation of the estimated temperatures $Te1\_l$, $Te1\_c$, $Te1\_f$ immediately after the first start switch 31 is turned on will be described. Since the calculation methods of the estimated temperatures $Te1\_l$, $Te1\_c$, $Te1\_f$ are also basically the same, calculation of the estimated temperature $Te1\_l$ of the first coil group 42 will be described as an example.

When the start switch 31 is turned off and then the start switch 31 is again turned on in a short time, it is assumed that the temperature of the first coil group 42 is kept to be high. In this case, when an active change temperature $\Delta Tea1\_l_{k-1}$ and a passive change temperature $\Delta Tep1\_l_{k-1}$ in a calculation cycle one cycle before are zero in Expressions (5) and (6), it is difficult to correctly estimate the estimated temperature $Te1\_l$ of the first coil group 42.

Based on this point, the first estimated temperature calculator 75 stores the active change temperature $\Delta Tea1\_l$ when the start switch 31 is turned off as a final active change temperature $\Delta Tea1\_lf$. The first estimated temperature calculator 75 stores the passive change temperature $\Delta Tep1\_l$ when the start switch 31 is turned off as a final passive change temperature $\Delta Tep1\_lf$. Then, in the calculation of the estimated temperature $Te1\_l$ when the start switch 31 is turned on, the first estimated temperature calculator 75 calculates the active change temperature $\Delta Tea1\_l_k$ in the present calculation cycle by using the final active change temperature $\Delta Tea1\_lf$ as the active change temperature $\Delta Tea1\_l_{k-1}$ in a calculation cycle one cycle before. The first estimated temperature calculator 75 also calculates the passive change temperature $\Delta Tep1\_l_k$ in the present calculation cycle by using the final passive change temperature $\Delta Tep1\_lf$ as the passive change temperature $\Delta Tep1\_l_{k-1}$ in the calculation cycle one cycle before.

The second estimated temperature calculator 85 executes calculation of the estimated temperatures $Te2\_l$, $Te2\_c$, $Te2\_f$ when the start switch 31 is turned on as in the first estimated temperature calculator 75. In this case, when abnormality occurs in the inter-microcomputer communication as described above and thereby energization to the second energization system is stopped in a trip before the start switch 31 is turned off, the first estimated temperature calculator 75 sets the passive change temperature $\Delta Tep1\_l$ of the first coil group 42 to zero, and also sets the final passive change temperature $\Delta Tep1\_lf$ to zero. In this case, the second estimated temperature calculator 85 sets the active change temperature $\Delta Tea2\_l$ of the second coil group 43 to zero, and also sets the final active change temperature $\Delta Tea2\_lf$ to zero. However, since the inter-microcomputer communication is abnormal, the second estimated temperature calculator 85 is unable to recognize the actual current value I1 of the first energization system. In other words, the second estimated temperature calculator 85 is unable to recognize the passive change temperature $\Delta Tep2\_l$, when calculating the estimated temperature $Te2\_l$ of the second coil group 43. As a solution, the second estimated temperature calculator 85 of the present embodiment stores an alternative temperature $\Delta Tealt$ as the final passive change temperature $\Delta Tep2\_lf$ of the second coil group 43.

The alternative temperature $\Delta Tealt$ is the passive change temperature $\Delta Tep2\_l$ when steering of a prescribed steering pattern is performed. The alternative temperature $\Delta Tealt$ is set in advance. The prescribed steering pattern is preferably a steering pattern in which a large assist force is applied from the motor 21, that is, a steering pattern in which a passive change temperature becomes larger.

Assume the case where abnormality in the inter-microcomputer communication is accidentally caused by the influence of noise or the like, and the abnormality is resolved by turning on the start switch 31 after the start switch 31 is turned off. In this case, the second estimated temperature calculator 85 calculates the estimated temperature $Te2\_l$ of the second coil group 43 by setting the active change temperature $\Delta Tea2\_l_{k-1}$ in a calculation cycle one cycle before to zero and setting the passive change temperature $\Delta Tep2\_l_{k-1}$ to the alternative temperature $\Delta Tealt$.

Next, the functions and effects of the present embodiment will be described. The steering controller 1 calculates the estimated temperatures of the protection targets in consideration of the passive change temperature attributed to energization to another system, in addition to the substrate temperatures Teb1, Teb2 and the active change temperature attributed to energization to the target system. Accordingly, it is possible to accurately estimate the temperature of the protection targets. Thus, the effect of estimating the temperature of the protection targets becomes notable when the temperature of the protection targets of the first energization system is estimated in the situation where, for example, the first current command value I1* is limited to be smaller due to drop of the source voltage Vb1 of the first in-vehicle power source B1, and thereby the actual current value I2 becomes larger than the actual current value I1. Thus, appropriate overheat protection control can be performed by restraining supply of a still larger current in the state where the temperature of the protection targets is high, or by restraining limitation of the current supplied in the state where the temperature of the protection targets is low.

The steering controller 1 calculates as the estimated temperatures of the protection targets a sum of the substrate temperature in the present calculation cycle, the active change temperature in the present calculation cycle, and the passive change temperature in the present calculation cycle. Accordingly, compared with the case where, for example, the substrate temperature when the start switch 31 is turned on is continuously used in a subsequent calculation cycle, the temperature of the protection targets can be estimated correctly.

The steering controller 1 calculates the active change temperature and the passive change temperature using Expressions (5) and (6). Accordingly, the active change temperature and the passive change temperature are calculated using delay filters. Hence, it is possible to accurately approximate phenomena in which the temperature of the protection targets changes with a time lag from generation of heat.

The active change gain is set to a value equal to or more than the passive change gain. The time constant of the active change delay filter is set to a value equal to or less than the time constant of the passive change delay filter. Therefore, it is possible to accurately approximate the phenomena in which the temperature of the protection targets is changed by receiving the influence of the active change temperature more than the influence of the passive change temperature.

The steering controller 1 stores the active change temperature when the start switch 31 is turned off as a final active change temperature, and the passive change temperature when the start switch 31 is turned off as a final passive change temperature. The steering controller 1 calculates the estimated temperature when the start switch 31 is subsequently turned on by using the final active change temperature as the active change temperature in the calculation cycle one cycle before and the final passive change temperature as the passive change temperature in the calculation cycle one cycle before. Accordingly, when the start switch 31 is turned off and then the start switch 31 is again turned on in a short time, the temperature of the protection targets can accurately be estimated. Even when the start switch 31 is turned off and then the start switch 31 is turned on after the lapse of a long time, it is possible to restrain the temperature of the protection targets from being estimated to be lower than the actual temperature.

When the start switch 31 is turned off in the state where abnormality had occurred in the inter-microcomputer communication, and then the start switch 31 is turned on, the steering controller 1 calculates the estimated temperatures of the protection targets of the energization system where energization is stopped, by using an alternative temperature as the passive change temperature in a calculation cycle one cycle before. Accordingly, when the start switch 31 is turned off and then the start switch 31 is again turned on in a short time, the temperature of the protection targets can accurately be estimated. Even when the start switch 31 is turned off, and then the start switch 31 is turned on after the lapse of a long time, the temperature of the protection targets can be restrained from being estimated to be lower than the actual temperature.

The first energization system, and the first microcomputer 53 and the first temperature sensors 59a, 59b corresponding to the first energization system are collectively mounted on the first regions Rc1, Rd1. The second energization system, and the second microcomputer 63 and the second temperature sensors 69a, 69b corresponding to the second energization system are collectively mounted on the second regions Rc2, Rd2. Accordingly, the temperature change of the protection targets corresponding to the first energization system and the temperature change of the protection targets corresponding to the second energization system tend to have a tendency similar to each other. Thus, it becomes easy to set the active change gain, the passive change gain, the time constant of the active change delay filter, and the time constant of the passive change delay filter.

The steering controller 1 includes two first temperature sensors 59a, 59b corresponding to the first energization system, and two second temperature sensors 69a, 69b corresponding to the second energization system. More specifically, since the steering controller 1 includes a plurality of temperature sensors for each of the first energization system and the second energization system, the temperature sensors can be made redundant and the reliability relating to temperature estimation can be enhanced.

Since the first temperature sensors 59a, 59b provided in the first energization system are made by different manufacturers, it is possible to restrain simultaneous failure of the first temperature sensors 59a, 59b which are made redundant. Similarly, since the second temperature sensors 69a, 69b provided in the second energization system are made by different manufacturers, it is possible to restrain simultaneous failure of the second temperature sensors 69a, 69b which are made redundant.

The first drive circuit 52 and the second drive circuit 62 are disposed such that the first drive circuit 52 and the second drive circuit 62 release heat to the common second heat sink 94. Hence, the first drive circuit 52 and the second drive circuit 62 exert influence of heat on each other via the second heat sink 94. The first smoothing capacitor 56 and the second smoothing capacitor 66 are disposed such that the first smoothing capacitor 56 and the second smoothing capacitor 66 release heat to the common first heat sink 93. Hence, the first smoothing capacitor 56 and the second smoothing capacitor 66 exert influence of heat on each other via the first heat sink 93. Therefore, as in the present embodiment, a large effect is obtained by calculating the estimated temperatures of the protection targets in consideration of the passive change temperature attributed to energization to another system, in addition to the substrate temperatures Teb1, Teb2 and the active change temperature attributed to energization to the target system.

The present embodiment may be carried out with modifications as shown below. The present embodiment and following modifications may be implemented in combination with each other without departing from the range of technically consistency.

In the embodiment, the first energization system, and the first microcomputer 53 and the first temperature sensors 59a, 59b corresponding to the first energization system may not collectively be mounted on the first regions Rc1, Rd1. Instead, they may be mounted over the first regions Rc1, Rd1 and the second regions Rc2, Rd2. Similarly, the second energization system, and the second microcomputer 63 and the second temperature sensors 69a, 69b corresponding to the second energization system may collectively be mounted over the first regions Rc1, Rd1 and the second regions Rc2, Rd2.

In the embodiment, the heat sink used for release of heat from the first drive circuit 52, and the heat sink used for release of heat from the second drive circuit 62 may be different members separated from each other. In short, the first drive circuit 52 and the second drive circuit 62 may release heat to different heat sinks. Similarly, the heat sink used for release of heat from the first smoothing capacitor 56 and the heat sink used for release of heat from the second smoothing capacitor 66 may be different members, and the heat sink used for release of heat from the first microcomputer 53 and the heat sink used for release of heat from the second microcomputer 63 may be different members.

In the embodiment, the steering controller 1 includes the control circuit substrate 91 and the drive circuit substrate 92. However, without being limited to this, the steering controller 1 may be configured to include a single circuit substrate, for example. In the embodiment, when abnormality occurs in the inter-microcomputer communication, the second current command value I2* may be calculated based on the current command value Im*bk for backup, and energization to the second coil group 43 may be continued.

In the embodiment, although the substrate temperatures Teb1, Teb2 are used as the reference temperature, without being limited to this, an ambient temperature in the steering controller 1 may be used as the reference temperature, for example. The steering controller 1 may include only one temperature sensor as a whole instead of one temperature sensor for each energization system. In this case, the first microcomputer 53 and the second microcomputer 63 calculate the estimated temperature by using a substrate temperature detected by the same temperature sensor as the reference temperature.

In the embodiment, the steering controller 1 may include only one temperature sensor corresponding to the first energization system. Similarly, the steering controller 1 may include only one temperature sensor corresponding to the second energization system. In the embodiment, the first temperature sensors 59a, 59b made by the same manufacturer may be adopted. Similarly, the second temperature sensors 69*a*, 69*b* made by the same manufacturer may be adopted.

In the embodiment, when abnormality occurs in the inter-microcomputer communication, and energization to the second energization system is stopped, the second estimated temperature calculator 85 stores a value zero as the final active change temperature $\Delta Tea2\_lf$ of the second coil group 43. However, without being limited to the configuration, the active change temperature $\Delta Tea2\_l$ when the abnormality has occurred in the inter-microcomputer communication may be stored as the final active change temperature $\Delta Tea2\_lf$, for example. When the start switch 31 is turned off in the state where abnormality had occurred in the inter-microcomputer communication, and then the start switch 31 is turned on, a value zero may be used as the passive change temperature in the cycle one cycle before instead of using the alternative temperature $\Delta$Tealt.

In the embodiment, in calculation of the estimated temperature when the start switch 31 is turned on, a value zero may be used as the active change temperature and the passive change temperature in the calculation cycle one cycle before, instead of the final active change temperature and the final passive change temperature.

In the method of calculating the active change temperature of the embodiment, Expression (5) may not be used. The method may be changed as appropriate. For example, in calculation of the estimated temperature Tell of the first coil group 42, the active change temperature $\Delta Tea1\_l_k$ may be calculated by setting two sets of an active change gain and a time constant and using following Expression (7):

$$\Delta Teal\_1_k = \\ (I1_k^2 \times Ka1\_la - \Delta Teal\_1_{k-1}) \times \left(1 - e^{\left(-\frac{t}{\tau a1\_1a}\right)}\right) + \\ (I1_k^2 \times Ka1\_lb - \Delta Teal\_1_{k-1}) \times \left(1 - e^{\left(-\frac{t}{\tau a1\_1b}\right)}\right) + \\ \Delta Teal\_1_{k-1}$$

Expression (7)

In Expression (7), "Ka1_*la*" and "Ka1_*lb*" indicate active change gains set in accordance with the first coil group 42, and "τa1_*la*" and "τa1_*lb*" indicate time constants of the active change delay filter set in accordance with the first coil group 42, respectively. Three or more sets of the active change gain and the time constant may be set. Similarly, two or more sets of the passive change gain and the time constant may be set to calculate the passive change temperature $\Delta Tep1\_l_k$.

In the embodiment, the active change gain may be set to a value smaller than the passive change gain. The time constant of the active change delay filter may be set to a value larger than the time constant of the passive change delay filter.

In the embodiment, the first coil group 42, the second coil group 43, the first smoothing capacitor 56, the second smoothing capacitor 66, the first drive circuit 52, and the second drive circuit 62 are set as the protection targets. However, the protection targets are not limited to these circuit elements. In addition to or instead of these circuit elements, circuit elements where a large current flows, such as the first electric current sensor 57 and the second electric current sensor, may be set as the protection targets. The first microcomputer 53 and the second microcomputer 63 may also be set as the protection target.

In the embodiment, the motor 21 including the first coil group 42 and the second coil group 43 is set as the control targets. However, without being limited to this, a motor including three or more coil groups may be set as the control target. In this case, the estimated temperature is a temperature obtained by adding the substrate temperature, the active change temperature, and a plurality of passive change temperatures corresponding to the number of energization systems that are other systems.

In the embodiment, a sum of the reference temperature, the active change temperature, and the passive change temperature is calculated as the estimated temperature of the protection target. However, the estimated temperatures of the protection target is not limited to this. For example, a value obtained by adding or subtracting a prescribed value to or from the sum may be calculated as the estimated temperature of the protection target.

In the embodiment, the steering controller 1 is configured to include the first microcomputer 53 and the second microcomputer 63. However, the steering controller 1 is not limited to this. For example, the steering controller 1 may be configured to include a single microcomputer serving as a processing circuit that outputs each of the first control signal Sc1 and the second control signal Sc2. For example, instead of the second microcomputer 63 calculating the estimated temperatures of the protection targets of the second energization system, the first microcomputer may calculate the estimated temperatures of the protection targets of the second energization system in addition to the estimated temperatures of the protection targets of the first energization system. The aspect of the calculation processes by the microcomputers may be changed as appropriate.

In the embodiment, although the steering device 2 is configured as an EPS device, the steering device 2 is not limited to this. For example, the steering device 2 may be configured as a steer-by-wire steering device with a motive power transmission between a steering unit and a turning unit being separated. In this case, the steering controller 1 may control operation of the motor that applies turning torque for turning the turning wheels 4, or may control operation of the motor that applies steering reaction force to the steering wheel 3. The steering controller 1 may also control operation of the motor that applies motor torque to devices other than the steering device.

In the embodiment, the steering controller 1 is not limited to the device including a CPU and a memory to execute software processing. For example, the steering controller 1 may include a dedicated hardware circuit (for example, an ASIC, etc.) for processing at least some of the software processing executed in the embodiment. Specifically, the steering controller may have any one of the configurations (a) to (c). (a) Configuration including a processing device that executes all the processes based on programs, and a program storage device such as a ROM that stores the programs. (b) Configuration including a processing device that executes some of the processes based on programs, a program storage device, and a dedicated hardware circuit that executes the remaining processes. (c) Configuration including a dedicated hardware circuit that executes all the processes. Here, the number of the software processing circuits including a processing device and a program storage device, or the number of the dedicated hardware circuits may be two or more. Specifically, the processes may be executed by a processing circuit (processing circuitry) including one or more software processing circuits or one or more dedicated hardware circuits.

What is claimed is:

1. A motor controller that controls a motor including a plurality of coil groups, comprising:
   individual drive circuits corresponding to the coil groups, respectively;
   a plurality of energization systems configured to supply drive electric power to the corresponding coil groups; and
   at least one processing circuit configured to output a plurality of individual control signals that control operation of the individual drive circuits, respectively, wherein:
   the processing circuit is configured to execute a first calculation process, a second calculation process, a third calculation process, and a fourth calculation process for each of the energization systems;
   the first calculation process is a process of calculating individual current command values that are target values of current supplied to the coil groups;
   the second calculation process is a process of calculating estimated temperatures of protection targets where the current of the energization systems flows;
   the third calculation process is a process of calculating individual limit values that are upper limits of the individual current command values based on the estimated temperatures;
   the fourth calculation process is a process of calculating the individual control signals based on the individual current command values that are limited by the individual limit values; and
   the processing circuit is configured to calculate, in the second calculation process, the estimated temperatures of the protection targets where current of a target system flows, based on a reference temperature detected by a temperature sensor provided in the motor controller, an active change temperature attributed to energization to the target system, and a passive change temperature attributed to energization to another system, the target system being the energization system that causes current to flow to the protection targets that are subjected to calculation of the estimated temperature, the other system being the energization system other than the target system.

2. The motor controller according to claim 1, wherein the processing circuit is configured to calculate, in the second calculation process, a sum of the reference temperature in a present calculation cycle, the active change temperature in the present calculation cycle, and the passive change temperature in the present calculation cycle as the estimated temperatures of the protection targets where the current of the target system flows.

3. The motor controller according to claim 1, wherein the processing circuit is configured to calculate, in the second calculation process, the active change temperature in the present calculation cycle by using subsequent Expression (1) and calculate the passive change temperature in the present calculation cycle by using subsequent Expression (2):

$$\Delta T\ eax_k = \left(1x_k^2 \times K\ ax - \Delta T\ eax_{k-1}\right) \times \left(1 - e^{\left(-\frac{t}{\tau ax}\right)}\right) + \Delta T\ eax_{k-1} \quad \text{Expression (1)}$$

where Ix is a current flowing through the target system,
Kax is an active change gain set in accordance with the protection targets,
τax is a time constant of an active change delay filter that is set in accordance with the protection targets,
t is a time interval between the calculation cycles, and
$\Delta Teax_{k-1}$ is the active change temperature in a calculation cycle that is one cycle before the present calculation cycle; and $$\Delta T\ epx_k = \left(1y_k^2 \times K\ px - \Delta T\ epx_{k-1}\right) \times \left(1 - e^{\left(-\frac{t}{\tau px}\right)}\right) + \Delta T\ epx_{k-1} \quad \text{Expression (2)}$$

where Iy is a current flowing through the other system,
Kpx is a passive change gain set in accordance with the protection targets,
τpx is a time constant of a passive change delay filter that is set in accordance with the protection targets,
t is a time interval between the calculation cycles, and
$\Delta Tepx_{k-1}$ is the passive change temperature in a calculation cycle that is one cycle before the present calculation cycle.

4. The motor controller according to claim 3, wherein the active change gain is set to a value equal to or more than the passive change gain.

5. The motor controller according to claim 3, wherein the time constant of the active change delay filter is set to a value equal to or less than the time constant of the passive change delay filter.

6. The motor controller according to claim 3, wherein:
   the processing circuit is configured to execute a first storage process and a second storage process, the first storage process being a process of storing the active change temperature when a start switch of a vehicle is turned off as a final active change temperature, the second storage process being a process of storing the passive change temperature when the start switch is turned off as a final passive change temperature;
   the processing circuit is configured to calculate, in the second calculation process when the start switch is turned on, the estimated temperatures of the protection targets by using the final active change temperature as the active change temperature in the calculation cycle one cycle before and using the final passive change temperature as the passive change temperature in the calculation cycle one cycle before.

7. The motor controller according to claim 6, wherein:
   the processing circuit includes a plurality of individual processing circuits provided for the energization systems, respectively;
   when abnormality occurs in communication between the individual processing circuits, the individual processing circuits are configured to continue energization to the energization system corresponding to any one of the individual processing circuits, while stopping energization to the energization system corresponding to another individual processing circuit; and
   in the second calculation process when the start switch is turned off in a state where the abnormality has occurred in the communication between the individual processing circuits and then the start switch is turned on, the other individual processing circuit is configured to calculate the estimated temperatures of the protection targets by using an alternative temperature that is larger than zero as the passive change temperature in the calculation cycle one cycle before.

8. The motor controller according to claim 3, further comprising:
the temperature sensors provided for each of the energization systems; and
a circuit substrate divided into a plurality of regions, wherein
the processing circuit includes a plurality of individual processing circuits provided for the energization systems, respectively; and
any one of the energization systems, and the processing circuit and the temperature sensor that correspond to the any one of the energization systems are collectively mounted on one of the regions.

9. The motor controller according to claim 8, wherein the energization systems each include the temperature sensors.

10. The motor controller according to claim 9, wherein the temperature sensors provided in each of the energization systems are made by different manufacturers.

11. The motor controller according to claim 1, wherein the protection targets are provided for each of the energization systems, the protection targets being disposed so as to release heat to a common heat sink.

12. The motor controller according to claim 1, wherein the motor is configured to apply motor torque to a steering device.

* * * * *